United States Patent
Fang et al.

(10) Patent No.: US 10,777,271 B2
(45) Date of Patent: Sep. 15, 2020

(54) METHOD AND APPARATUS FOR ADJUSTING DEMARCATION VOLTAGES BASED ON CYCLE COUNT METRICS

(71) Applicant: Intel Corporation, Santa Clara, CA (US)

(72) Inventors: Wei Fang, El Dorado Hills, CA (US); Prashant S. Damle, Portland, OR (US); Nevil N. Gajera, Meridian, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,438

(22) Filed: Sep. 29, 2017

(65) Prior Publication Data

US 2019/0103160 A1    Apr. 4, 2019

(51) Int. Cl.
*G11C 16/34*    (2006.01)
*G11C 13/00*    (2006.01)
*G11C 29/02*    (2006.01)

(52) U.S. Cl.
CPC ........ *G11C 13/004* (2013.01); *G11C 13/0004* (2013.01); *G11C 13/0035* (2013.01); *G11C 29/028* (2013.01); *G11C 13/0026* (2013.01); *G11C 13/0028* (2013.01); *G11C 2013/005* (2013.01); *G11C 2213/71* (2013.01)

(58) Field of Classification Search
CPC .................................................. G11C 11/5642
USPC .................................................... 365/185.18
See application file for complete search history.

(56) References Cited

U.S. PATENT DOCUMENTS

| 2007/0070696 | A1  |  3/2007 | Avraham et al. |
|---|---|---|---|
| 2008/0316802 | A1  | 12/2008 | Happ et al. |
| 2010/0037006 | A1* |  2/2010 | Chen ................... G06F 12/0246  711/103 |
| 2010/0246266 | A1* |  9/2010 | Park ....................... G11C 16/10  365/185.11 |
| 2011/0134685 | A1  |  6/2011 | Kau et al. |
| 2012/0268994 | A1* | 10/2012 | Nagashima ......... G06F 11/1048  365/185.11 |
| 2015/0124532 | A1* |  5/2015 | Merandat ............... G11C 16/22  365/185.19 |
| 2016/0093340 | A1* |  3/2016 | Sun ........................ H01L 24/00  365/51 |
| 2016/0141044 | A1* |  5/2016 | Sun ....................... G11C 16/10  365/185.11 |
| 2016/0170871 | A1* |  6/2016 | Hyun ....................... G06F 3/06  711/103 |
| 2016/0179415 | A1* |  6/2016 | Lee ...................... G06F 3/0619  711/162 |

(Continued)

OTHER PUBLICATIONS

EPO Partial Search Report issued for EP Patent Application No. 18191341.9, dated Feb. 26, 2019; 14 pages.

(Continued)

*Primary Examiner* — Min Huang
(74) *Attorney, Agent, or Firm* — Alliance IP, LLC

(57) ABSTRACT

In one embodiment, an apparatus comprises a first memory array comprising a plurality of phase change memory (PCM) cells; and a controller to track a first cycle count metric based at least in part on a number of writes performed to at least a portion of the first memory array; and adjust, based on the first cycle count metric, a demarcation voltage to be applied during read operations performed on PCM cells of the first memory array.

24 Claims, 6 Drawing Sheets

(56) References Cited

U.S. PATENT DOCUMENTS

2016/0179617 A1* 6/2016 Lee .................... G06F 11/1072
                                                        714/755
2017/0154657 A1* 6/2017 Kim ........................ G11C 7/00
2017/0309343 A1* 10/2017 Lim .................... G06F 12/1009
2018/0075919 A1* 3/2018 Pang ................. G11C 16/0466

OTHER PUBLICATIONS

EPO; Extended European Search Report issued in EP Patent Application No. 18191341.9, dated Jul. 16, 2019; 12 pages.
EPO; Office Action issued in EP Patent Application No. 18191341.9, dated Jul. 6, 2020; 33 pages.

* cited by examiner

400

METHOD AND APPARATUS FOR ADJUSTING DEMARCATION VOLTAGES BASED ON CYCLE COUNT METRICS

FIELD

The present disclosure relates in general to the field of computer development, and more specifically, to read operations for memory.

BACKGROUND

A storage device may include a crosspoint memory technology such as multi-stack three dimensional (3D) crosspoint memory cells. A demarcation voltage (VDM) applied to a memory cell during a read operation may allow a determination of the state of the memory cell (e.g., whether the memory cell stores a logical 0 or 1 value).

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
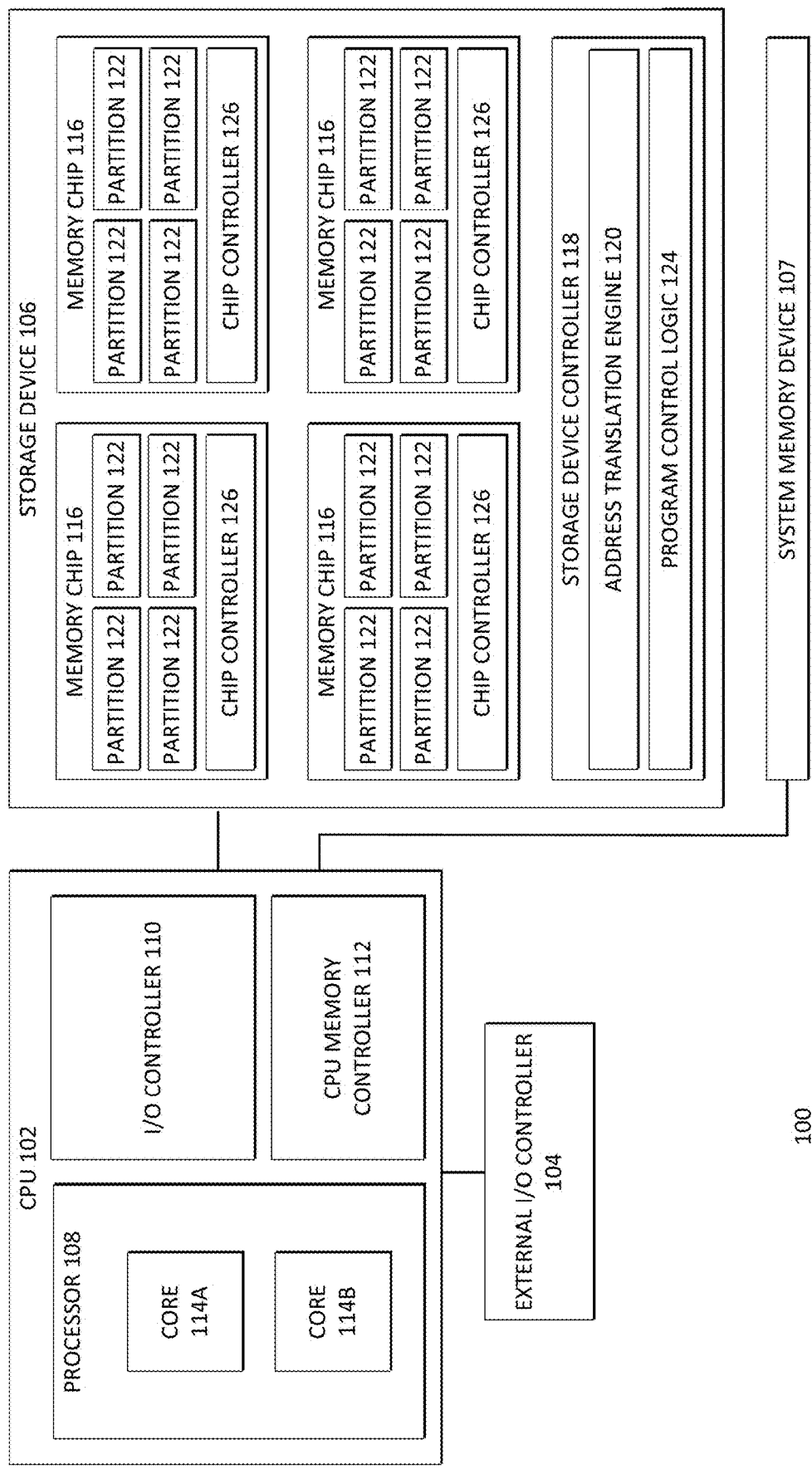
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a storage device 106, and system memory device 107. During operation, data may be transferred between a storage device 106 or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

A memory partition may include a 3D crosspoint memory array. In some embodiments, a 3D crosspoint memory array may comprise a transistor-less (i.e., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

3D crosspoint memory cells may have better intrinsic endurance than other types of memory cells (e.g., NAND flash memory cells). However, 3D crosspoint memory cells have a finite endurance which is specified by the number of write cycles (i.e., write operations performed on the memory cells). Due to cycling, the threshold voltages of both set (logic one) and reset (logic zero) memory cells shift downward (i.e., the threshold voltages become smaller). Over time, the application of the default VDM results in bits being sensed erroneously (e.g., bits set to logical zero may be sensed as logical ones). In some situations, the number of error bits during a read may be greater than the number of bits that error correction logic may correct. Various embodiments of the present disclosure dynamically track cycle count metrics and adjust VDMs accordingly to reduce error rates and prolong the life of 3D crosspoint memory cells of the storage device 106.

CPU 102 comprises a processor 108, such as a microprocessor, an embedded processor, a DSP, a network processor, a handheld processor, an application processor, a co-processor, an SOC, or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that maintains its state even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory module may include non-volatile memory and/or volatile memory.

Non-volatile memory is a storage medium that does not require power to maintain the state of data stored by the medium. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or other manner. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122. Accordingly, in some embodiments, storage device 106 may comprise one or more packages that each include one or more memory chips 116 that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to the memory chips 116, and provide data associated with the requests to CPU 102 (e.g., via CPU memory controller 112 or I/O controller 110). Controller 118 may also be operable to detect and/or correct errors encountered during memory operations via an error correction code (ECC) engine. In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations (e.g., voltage levels of one or more VDMs) based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In a particular embodiment, the chip controller 126 controls the value of a VDM used by each partition 122 of the memory chip during memory read operations. In various embodiments, the chip controller 126 controls the values of a plurality of VDMs for the chip (for example, multiple different VDMs may be applied during a read operation if one or more of the VDMs results in unsatisfactory sensing results). In some embodiments, the chip controller 126 may adjust the value of the one or more VDMs in response to a request sent by storage device controller 118 specifying the value of the VDM(s) to be used for the memory chip 116. The storage device controller 118 may send any suitable command (e.g., a proprietary or user mode command) to shift the VDM(s) of a particular memory chip 116. In a particular embodiment, the chip controller 126 controls a global bias that supplies the VDM of the entire memory chip 116 and thus the amount of the VDM does not need to be explicitly communicated to the controllers of the partitions 122. In various embodiments, the chip controller 126 may store the adjusted VDM value(s) in non-volatile storage such that the adjusted VDM value(s) are protected against power failures.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
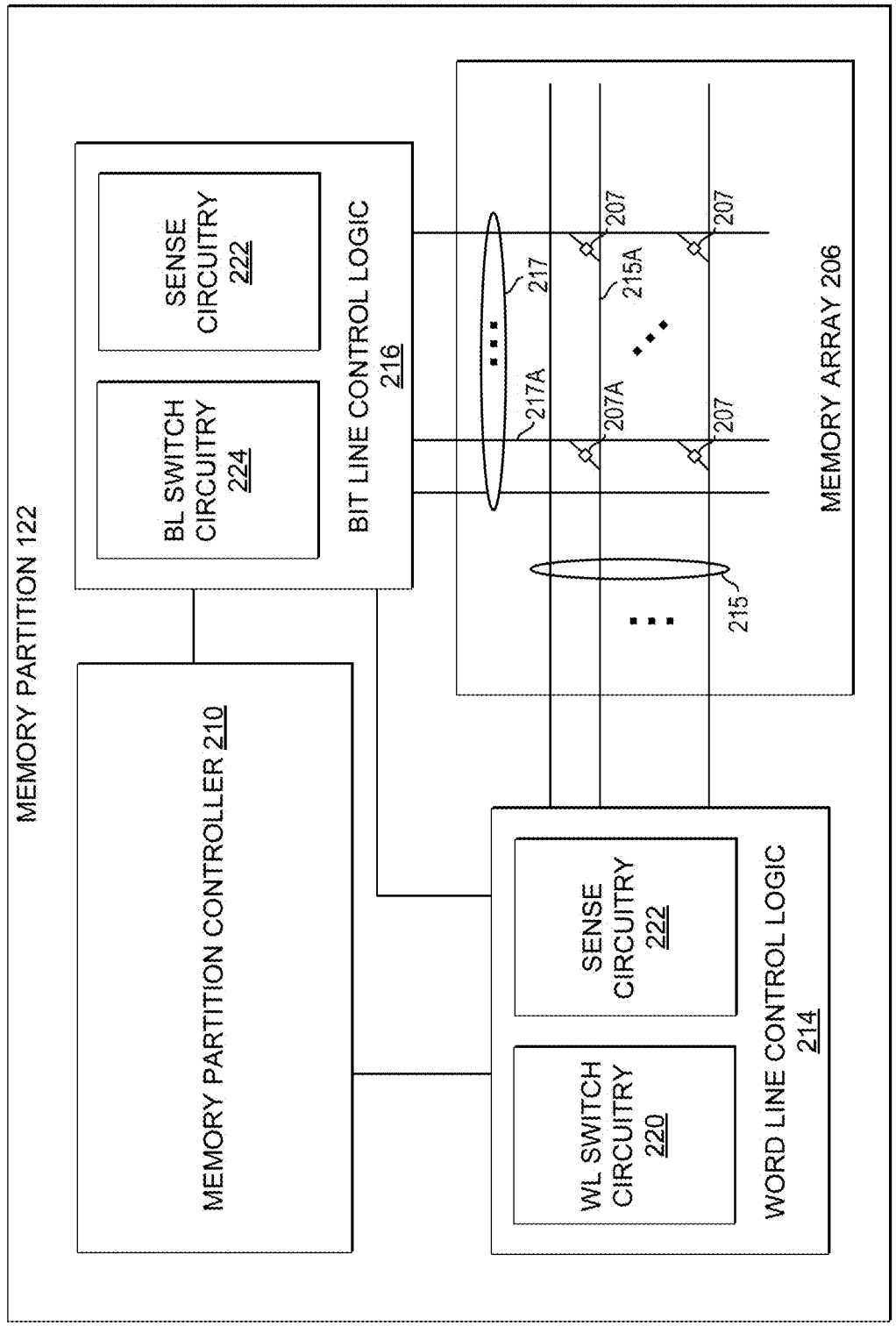
FIG. 2 illustrates a memory partition in accordance with certain embodiments.

FIG. 2 illustrates an example memory partition 122 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, i.e., a select device coupled to the memory element. The select devices are configured to facilitate combining a plurality of memory elements into an array.

In some embodiments, a 3D crosspoint memory array 206 may comprise a transistor-less (i.e., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (i.e., crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION and/or MICRON TECHNOLOGY, INC.

During a programming operation (i.e., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a first time period sufficient to cause the memory element to "snap back" and then maintained for a second time period to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage (a demarcation read voltage (VDM)) across the memory element is configured to be greater than a maximum set voltage and less than a minimum reset voltage for the memory element. In a particular embodiment, a voltage of the WL (V(WL)) at the cell may go down and a voltage of the BL (i.e., V(BL)) at the cell may be pulled up such that V(BL)-V(WL) is equal to a total bias on the 3D crosspoint cell (i.e., the VDM).

In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bit-line electrode of the 3D crosspoint cell may be a positive regulated node and the word-line electrode coupled to the cell may supply the bias for VDM.

In the embodiment of FIG. 2, a memory partition 122 includes memory partition controller 210, word line control logic 214, bit line control logic 216, and memory array 206. A host device (e.g., CPU 102) may provide read and/or write requests including memory address(es) and/or associated data to memory partition 122 (e.g., via storage device controller 118 and chip controller 126) and may receive read data from memory partition 122 (e.g., via the chip controller 126 and storage device controller 118). Memory partition controller 210 (in conjunction with word line control logic 214 and bit line control logic 216) is configured to perform memory access operations, e.g., reading a target memory cell and/or writing to a target memory cell.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc. Memory array 206 may be configured to store binary data and may be written to (i.e., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to WL select bias voltage to select the respective WL 215A. For example, switch circuitry 220 may include a plurality of transistors.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207, for a read operation by coupling WL 215A to WL select bias voltage and BL 217A to BL select bias voltage. One or both of sense circuitries 222 may then be configured to monitor WL 215A and/or BL 217A for a sensing interval in order to determine the state of the memory cell 217A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a word-line load connected to a word-line electrode to convert a current on the word-line electrode to a voltage that is a first input to a voltage comparator (i.e., sense amp) of the sense circuitry. An equivalent word-line load may be connected to a reference current to provide a voltage that is a second input to the voltage comparator. When a particular word-line and bit-line are selected in the array, the word-line load on the word-line electrode may convert the current on the selected bit-line to a voltage. In some embodiments, leakage components of the current can be mitigated by respectively selecting a bias for all other unselected word-lines and bit-lines that reduces or minimizes leakage. Capacitive components of the current can be mitigated by allowing sufficient time for the capacitive components to dissipate. The current that is converted to the first input to the voltage comparator may correspond with the current of the target memory cell. The reference current may be selected such that the current of the target memory cell is lower than the reference current before snapback of the target memory cell and higher than the reference current after snapback of the target memory cell. In this manner, an output of the voltage comparator may be indicative of a state of the target memory cell. A latch may be coupled to the output of the voltage comparator to store the output of the read operation.

Figure 3:
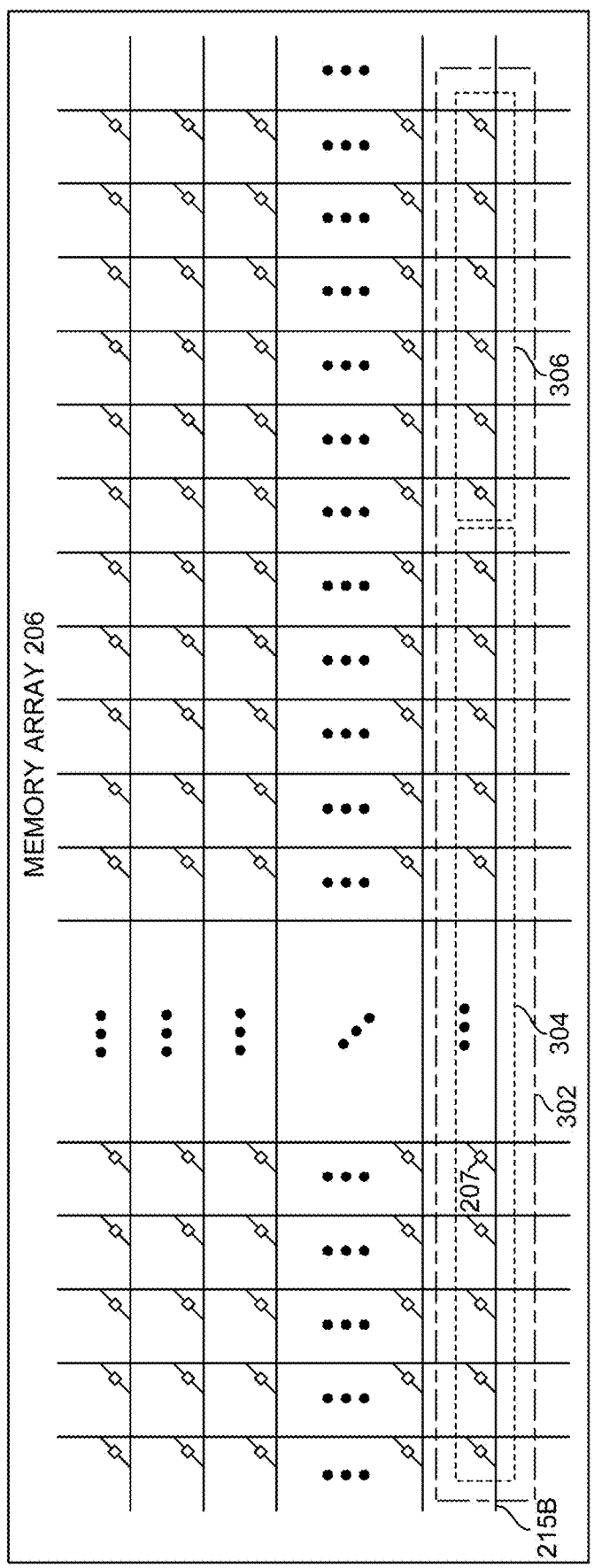
FIG. 3 illustrates a memory array in accordance with certain embodiments.
Figure 4:
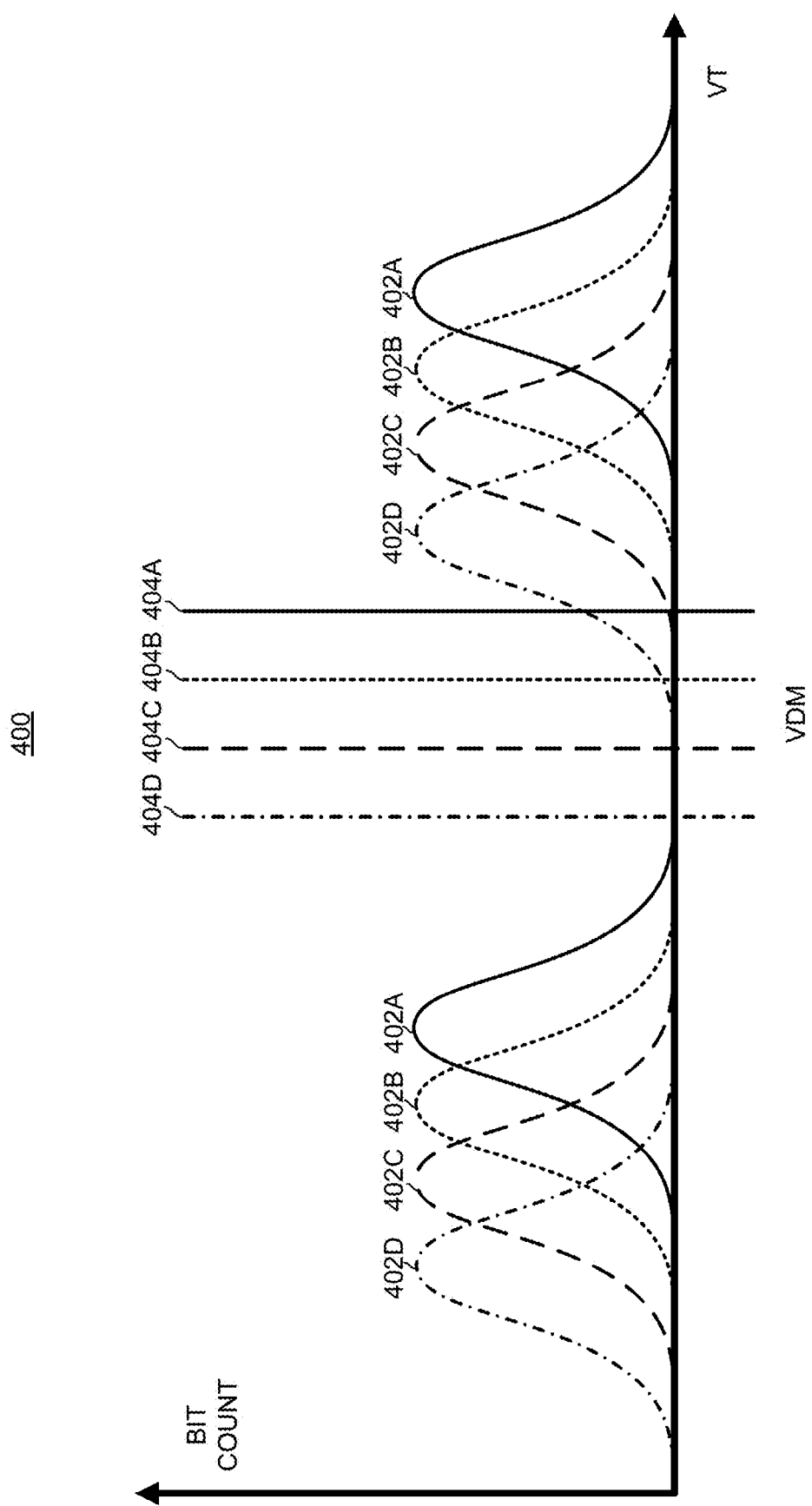
FIG. 4 illustrates a graph depicting memory cell threshold voltage distributions and corresponding demarcation voltages in accordance with certain embodiments.

FIG. 3 illustrates a memory array 206 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215B, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. As another example, the metadata portion 306 may store a write cycle count that is indicative of the number of times the slice 302 has been written to.

Figure illustrates a graph 400 depicting memory cell threshold voltage distributions 402 (i.e., 402A-D) and corresponding demarcation voltages 404 (i.e., 404A-D) in accordance with certain embodiments. The horizontal axis depicts threshold voltages of memory cells of an array and the vertical axis depicts bit counts (i.e., number of memory cells). Thus, each point of a distribution 402 represents a number of cells having a particular threshold voltage. The graph 400 assumes that half of the bits of the array are in a set state (i.e., have a threshold voltage lower than the corresponding VDM) and half of the bits are in a reset state (i.e., have a threshold voltage higher than the corresponding VDM).

Distribution 402A represents a baseline distribution and corresponding VDM 404A represents a baseline VDM that may be used when the memory cells follow the baseline distribution (e.g., this may be the VDM that is used when the cells are relatively new). As the number of writes performed to the memory cells increase, the threshold voltages of the cells in both the set state and the reset state may decrease. Accordingly, after a particular number of write cycles have occurred, the baseline distribution 402A may shift to the left of the graph. Accordingly, (assuming relatively equal distribution of write cycles among the cells of the array) distribution 402B represents a distribution of the memory cells after a first number of write cycles have been performed, 402C represents a distribution of the memory cells after a second number of write cycles have been performed (where the second number is higher than the first number), and 402D represents a distribution of the memory cells after a third number of write cycles have been performed (where the third number is higher than the second number).

If the baseline VDM 404A is maintained even after the distribution of threshold voltages have shifted to the left, read errors may result as cells that are in the reset state (shown on the right side of the graph) may mistakenly be sensed as being in the set state. The number of read errors may increase as the write cycle count rises and the distribution shifts further to the left. Accordingly, the number of errors is more pronounced when comparing the baseline VDM 404A against the right side of the distribution 402D, but errors are still noticeable when comparing the baseline VDM 404A against the right side of distribution 402C, and read errors may still occur when using VDM 404A with an array exhibiting distribution 402B if the tail of the distribution of the cells in the reset state is long enough.

In various embodiments of the present disclosure, the VDM applied during read operations may be adjusted based on one or more cycle count metrics indicative of the number of write cycles performed on a group of cells. For example, after a particular cycle count metric crosses a corresponding threshold, VDM 404B may be applied instead of VDM 404A, after the cycle count metric crosses a second threshold, VDM 404C may be applied, and after the cycle count metric crosses a third threshold, VDM 404D may be applied. Such embodiments may reduce the amount of read errors encountered as well as prolong the useful life of the memory cells.

In various embodiments, some read operations may involve application of a plurality of VDMs. For example, during the read operation, a first VDM may be applied to each cell of a group of cells and the states of the cells are sensed. If the sensing operation is successful (e.g., the number of errors detected in the read data may be corrected by an ECC engine), the read operation is completed. However, if the sensing operation is unsuccessful, a second VDM (which is generally higher than the first VDM) may be applied and the cells may be sensed again. If this sensing operation is unsuccessful, a third VDM (which is generally higher than the second VDM) may be applied and the cells may be sensed again. Any suitable number of VDMs may be applied during the read operation. In some embodiments, if none of the applied VDMs result in a successful read, a data restoration procedure may be performed to try to recover the data stored in the cells and/or the read may be deemed unsuccessful.

In various embodiments, any one or more of the multiple VDMs (i.e., a set of VDMs) applied during a read operation may be adjusted based on one or more cycle count metrics. For example, in a particular embodiment, only the first VDM is adjusted. As another example, the first and the second VDMs are adjusted. As another example, all of the VDMs are adjusted. When multiple VDMs are adjusted, they may be adjusted by the same amount or by different amounts. In various embodiments, any one or more VDMs of a VDM set may be adjusted by any suitable amounts based on one or more cycle count metrics.

In a particular embodiment, the VDMs are assigned on a per-chip basis. For example, a first memory chip 116 may be assigned a first VDM (or set of VDMs as described above), a second memory chip 116 may be assigned a second VDM (or second set of VDMs), and so on. The VDM(s) assigned to a chip may be used as the VDM(s) for all reads performed on any partition of the memory chip 116. The VDM(s) of a chip may be independently adjusted. For example, the VDM(s) for a first memory chip 116 may be adjusted without affecting the VDM(s) for a second memory chip 116.

In other embodiments, the VDMs may be assigned using any suitable granularity. For example, the VDMs may be assigned on a per-partition basis with each VDM being adjusted based on a cycle count metric specific to the respective partition. As another example, a VDM may be assigned on a per-storage device level (i.e., all of the memory chips 116 may use the same VDM). This disclosure contemplates any suitable assignment scheme for the VDMs although the discussion below will focus on the per-chip assignment scheme.

Figure 5:
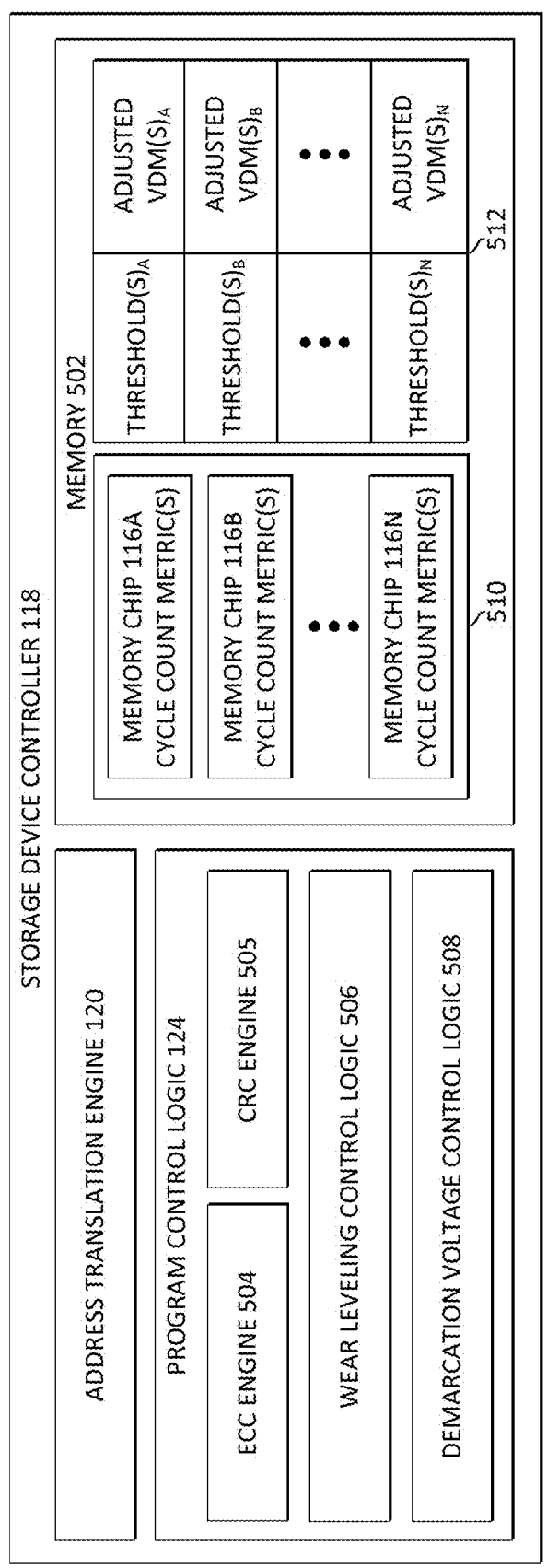
FIG. 5 illustrates a storage device controller to track cycle count metrics and adjust demarcation voltages in accordance with certain embodiments.

FIG. 5 illustrates a storage device controller 118 to track cycle count metrics 510 and adjust VDMs in accordance with certain embodiments. In the embodiment depicted, controller 118 includes address translation engine 120, program control logic 124, and memory 502, which may include any suitable volatile or non-volatile memory. Program control logic includes ECC engine 504, CRC engine 505, wear leveling control logic 506, and demarcation voltage control logic 508.

ECC engine 504 includes logic to detect and correct errors in data read from the various partitions 122 of the storage device 106. In various embodiments, when storage device controller 118 receives data from a host device (e.g., CPU 102) to be written to the storage device, the ECC engine 504 (or other suitable logic of the storage device controller 118) may add parity bits to the data to be written. These parity bits are then written along with the data in a memory array 206 of a partition 122 (e.g., the parity bits may be written to the metadata portion 306 of a slice 302 while the data is written to the payload portion 304 of the slice 302).

In various embodiments, when payload data is read from a memory array 206, the data may be provided to the ECC engine 504, along with the parity bits. The ECC engine 504 may check the parity bits to determine the existence of errors in the data. If the number of errors is beyond the capability of the ECC engine to correct (e.g., the errors are higher than a threshold), the ECC engine 504 may deem the errors to be uncorrectable. In such cases, the read may be reissued, an alternative error correcting scheme may be attempted, the read may be deemed unsuccessful, or other suitable action may be performed. If the ECC deems the errors to be correctable, the ECC engine may attempt to correct the errors (e.g., by manipulating the read data based on the parity bits).

CRC engine 505 may perform any suitable data verification operations. In various embodiments, when a host sends a write request for payload data, the write request may include CRC bits which are written to the memory cells along with the payload data. Alternatively, the CRC engine 505 may generate CRC bits from the data based on a CRC algorithm, and these CRC bits may be written with the data. In various embodiments, when a host-initiated read is performed, the CRC bits associated with the payload data are read and returned to the storage device controller 118 along with the payload data. As described above, the payload data may be passed to the ECC engine 504 for error correction and the result may then be passed to the CRC engine 505. The CRC engine may process the data based on a CRC algorithm and determine whether the results match the CRC bits associated with the data. If the results match, the data is then returned to the host. If the results do not match, the read may be retried, an error may be reported to the host, or other suitable action may be performed.

Wear leveling control logic 506 may include logic to track statistics related to the number of times various groups of memory cells of the storage device 106 have been written to. In a particular embodiment, wear leveling control logic 506 may update write cycle counts for groups of memory cells (e.g., for slices 302) and cause the updated write cycle counts to be written to the slices. For example, wear leveling control logic may track the write cycle counts for the various slices of the partitions 122 of storage device 106, where the slices may have payload data of any suitable size, such as 1KiB, 2KiB, 4KiB, 8KiB, or other suitable size. In various embodiments, wear leveling control logic 506 may track any suitable metrics based on the write cycle counts.

In various embodiments, wear leveling control logic 506 may distribute write requests among the various memory arrays 206 of the storage device based on the write cycle counts and/or metrics derived therefrom, so as to avoid a disproportionate number of writes to any particular array 206 (or portion thereof). The wear leveling control logic 506 may determine where particular data is to be stored and communicate the location to the address translation engine 120 such that the data may be located when the host requests the data.

Demarcation voltage (VDM) control logic 508 generates and/or monitors various cycle count metrics 510 and determines whether to adjust one or more VDMs based on the cycle count metrics. In various embodiments, this may comprise reading one or more write cycle counts associated with the slices (or other grouping of cells) and/or calculating metrics dynamically as write requests are received from the host. A cycle count metric may comprise any suitable metric based on the number of times one or more groups of cells (e.g., the cells of one or more slices, arrays, partitions, or chips) have been written to. In the embodiment depicted, VDM control logic 508 tracks one or more cycle count metrics 510 for each memory chip 116 (though in other embodiments, cycle count metrics may be tracked for any suitable grouping of memory cells). These cycle count metrics 510 may be stored in memory 502. In the embodiment depicted, memory 502 stores one or more cycle count metrics for each memory chip of memory chips 116A-116N.

In a particular embodiment, a cycle count metric is a point of a distribution (or approximated distribution) of write cycle counts for a plurality of slices (or other groups) of memory cells (e.g., all of the slices of a particular memory chip 116 or a sampled portion thereof). As an example, the cycle count metric may be a number of standard deviations ($\sigma$) from the mean ($\mu$) of a plurality of write cycle counts. For example, in a particular embodiment, a cycle count metric is the $\mu-3\sigma$ point of the distribution of write cycle counts (e.g., the write cycle count which is less than roughly 99.9% of the write cycle counts of the distribution). In other embodiments, a cycle count metric may be any other point of the distribution, such as $\mu-2\sigma$, $\mu-\sigma$, $\mu$ (i.e., the mean), $\mu+\sigma$, $\mu+2\sigma$, $\mu+3\sigma$, or other suitable point on the distribution. In various embodiments, the cycle count metric is based on an approximation of a distribution. For example, 1000 write cycle counts may be sampled and the second lowest write cycle count may be used as an approximation of the $\mu-3\sigma$ point for an entire chip. In various embodiments, the sampling (e.g., of the write cycle counts) performed to determine the one or more cycle count metrics may be sampling that is performed by the wear leveling control logic 506 during performance of wear leveling.

In a particular embodiment, a cycle count metric may be the maximum write cycle count of a plurality of write cycle counts (e.g., the maximum write cycle count of all slices of a particular memory chip 116), the minimum write cycle count, or other suitable metric based on the number of writes performed on one or more groups of memory cells.

The VDM control logic 508 may monitor the cycle count metrics 510 and adjust VDM voltages based on the cycle count metrics. In a particular embodiment, VDM control logic 508 may compare a cycle count metric for a memory chip 116 against associated thresholds stored in table 512. When a cycle count metric for memory chip 116A crosses a threshold, the VDM control logic 508 may cause a VDM of memory chip 116A to be adjusted downward to an adjusted VDM associated with the threshold in table 512. For example, when the cycle count metric crosses threshold$_A$, the VDM of the chip may be set to adjusted VDM$_A$. Later, when the cycle count metric crosses threshold$_B$, the VDM of the chip may be set to adjusted VDM$_B$ (which is lower than VDM$_A$). When additional thresholds are crossed, the VDM for the chip may be adjusted downward accordingly. In various embodiments, the same thresholds are used for the cycle count metric(s) of each memory chip 116, though in other embodiments the thresholds may be customized for each chip.

As an example, a baseline VDM may be used for a chip until the $\mu-3\sigma$ write cycle count of the slices of a particular memory chip reaches a first threshold of 30,000 writes. At that point, the VDM for the chip may be adjusted downward by 150 mV. When the $\mu-3\sigma$ write cycle count of the slices of the memory chip reaches a second threshold of 90,000 writes, the VDM may be adjusted downward by another 150 mV. As an example, a voltage adjustment may be between 10 and 500 mV for each threshold that is crossed.

In other embodiments, a VDM may be adjusted in any other suitable manner. For example, the VDMs may be adjusted on a periodic basis by determining one or more cycle count metrics and adjusting the VDM based on the cycle count metrics. As one example, a VDM may be periodically determined based on any suitable equation, such as $VDM_{adjusted} = VDM_{baseline} - \max(0, K*(\log_N(\text{cycle count metric})-J))$, where K and J may be any suitable constants and N may be any suitable base (e.g., a value between 1.5 and 4). The VDMs of the chips may be updated at any suitable interval (e.g., after a particular amount of time has elapsed since the last update or a number of write cycles have been performed on the storage device 106, or any other suitable interval).

In various embodiments, a VDM of a memory chip 116 may be adjusted based on multiple cycle count metrics associated with the memory chip 116. For example, each cycle count metric may be associated with a threshold. In a particular embodiment, if any of these thresholds are crossed by their respective cycle count metric, the VDM may be adjusted to a new VDM associated with the thresholds. As an example, a VDM may be adjusted when either a maximum write cycle count crosses an associated threshold or a $\mu-3\sigma$ write cycle count crosses a threshold (i.e., the first metric to cross its associated threshold may trigger an adjustment of the VDM). In an alternative embodiment, the VDM is adjusted when each threshold of a plurality of thresholds is crossed by its respective cycle count metric.

In various embodiments, multiple VDMs of a VDM set for a memory chip 116 may be adjusted based on the one or more cycle count metrics. A VDM set may include two or more VDMs of different values that are applied during a read operation in which multiple VDMs are applied because of a sensing failure during application of one (or more) of the VDMs. As an example, when a threshold is crossed by a cycle count metric, two or more VDMs of a VDM set for a memory chip may be adjusted. As another example, when VDMs are updated periodically, two or more VDMs of a VDM set are updated together. In a particular embodiment, a VDM set for a memory chip includes three VDMs and the two lowest valued VDMs are adjusted together while the third VDM (i.e., the highest valued VDM) is not adjusted (e.g., to provide accurate results if the threshold voltages of the target cells have risen since being set).

In a particular embodiment, when multiple VDMs of a VDM set are adjusted, the VDMs of the VDM set that are being adjusted are adjusted by the same amount. In an alternative embodiment, the VDMs of the VDM set may each be adjusted by a different amount.

In various embodiments, when a VDM (or multiple VDMs of a VDM set) is to be adjusted, VDM control logic 508 may cause storage device controller 118 to send a request to the chip controller 126 of the memory chip 116 that is to change its VDM(s). The request may include an identification of the new value(s) for the VDM(s). The adjusted value for a VDM may be expressed in any suitable manner, such as an offset from a baseline VDM or as the actual value of the VDM.

In various embodiments, the adjusted VDMs are restored after a power cycle. For example, the adjusted VDMs may be stored in non-volatile memory of the storage device controller 118 or the chip controllers 126. As another example, the cycle count metrics may be recalculated by the storage device controller 118 after a power cycle and sent to the chip controllers 126.

Figure 6:
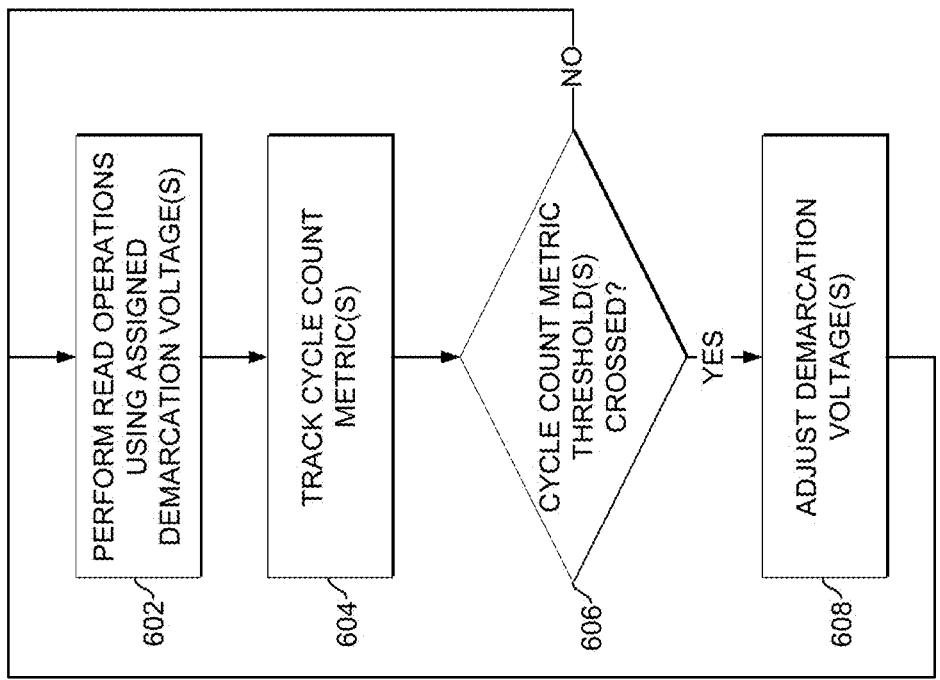
FIG. 6 illustrates an example flow for adjusting one or more demarcation voltages based on one or more cycle count metrics in accordance with certain embodiments.

FIG. 6 illustrates an example flow for adjusting one or more VDMs based on one or more cycle count metrics in accordance with certain embodiments. At 602, read operations are performed on a memory chip using assigned VDMs. For example, when a chip has a relatively low number of write cycles, a baseline VDM may be used during read operations. In some embodiments, a plurality of VDMs (i.e., a baseline VDM set) may be used during read operations.

At 604, one or more cycle count metrics are tracked for the chip. At 606, a determination is made as to whether a threshold associated with a cycle count metric has been crossed. If no cycle count thresholds have been crossed, the read operations resume at 602 using the same DMV(s). If a cycle count metric threshold is crossed at 606, one or more VDMs of the chip is adjusted. The adjusted VDM(s) are then used to perform additional read operations at 602.

The flow described in FIG. 6 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 6 may be repeated, combined, modified or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine, memory partition 122, program control logic 124, chip controller 126, memory partition controller 210, word line control logic 214, bit line control logic 216, memory 502, ECC engine 504, CRC engine 505, wear leveling control logic 506, demarcation voltage control logic 508, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a first memory array comprising a plurality of phase change memory (PCM) cells; and a controller to track a first cycle count metric based at least in part on a number of writes performed to at least a portion of the first memory array; and adjust, based on the first cycle count metric, a demarcation voltage to be applied during read operations performed on PCM cells of the first memory array.

In an embodiment, an apparatus is to track a second cycle count metric based at least in part on a number of writes performed to at least a portion of a second memory array comprising a second plurality of PCM cells, wherein a first memory chip comprises the first memory array and a second memory chip comprises the second memory array; and adjust, based on the second cycle count metric, a demarcation voltage to be applied during read operations performed on PCM cells of the second memory array. In an embodiment, the adjusted demarcation voltage is to be applied during read operations performed on PCM cells of a plurality of memory arrays of a semiconductor chip. In an embodiment, an apparatus is to adjust, based on the first cycle count metric, a plurality of demarcation voltages to be applied during a read operation performed on PCM cells of the first memory array. In an embodiment, the demarcation voltage is adjusted in response to a determination that the first cycle count metric has crossed a threshold. In an embodiment, the first cycle count metric is a $\mu$–$3\sigma$ write cycle count of a distribution of write cycle counts of a plurality of groups of PCM cells. In an embodiment, the first cycle count metric is an average of write cycle counts of a plurality of groups of PCM cells. In an embodiment, the first cycle count metric is a maximum write cycle count of a plurality of groups of PCM cells. In an embodiment, an apparatus is to track a second cycle count metric based at least in part on the number of writes performed to at least a portion of the first memory array; and adjust, based on the second cycle count metric, the demarcation voltage to be applied during read operations performed on PCM cells of the first memory array. In an embodiment, an apparatus is to derive the at least one cycle count metric from information tracked by the controller to perform wear leveling among multiple memory arrays. In an embodiment, the first cycle count metric is based on a write cycle count for a slice of PCM cells of the first memory array, wherein the write cycle count is stored in the slice.

In at least one embodiment, a method comprises tracking a first cycle count metric based at least in part on a number of writes performed to at least a portion of a first memory array comprising a plurality of memory cells; and adjusting, based on the first cycle count metric, a demarcation voltage to be applied during read operations performed on memory cells of the first memory array.

In an embodiment, a method further comprises tracking a second cycle count metric based at least in part on a number of writes performed to at least a portion of a second memory array comprising memory cells, wherein a first memory chip comprises the first memory array and a second memory chip comprises the second memory array; and adjusting, based on the second cycle count metric, a demarcation voltage to be applied during read operations performed on memory cells of the second memory array. In an embodiment, a method further comprises applying the adjusted demarcation voltage during read operations performed on memory cells of a plurality of memory arrays of a semiconductor chip. In an embodiment, a method further comprises adjusting, based on the first cycle count metric, a plurality of demarcation voltages to be applied during a read operation performed on memory cells of the first memory array. In an embodiment, a method further comprises adjusting the demarcation voltage in response to a determination that the first cycle count metric has crossed a threshold. In an embodiment, the first cycle count metric is a $\mu$–$3\sigma$ write cycle count of a distribution of write cycle counts of a plurality of groups of memory cells. In an embodiment, the first cycle count metric is an average of write cycle counts of a plurality of groups of memory cells. In an embodiment, the first cycle count metric is a maximum write cycle count of a plurality of groups of memory cells. In an embodiment, a method further comprises tracking a second cycle count metric based at least in part on the number of writes performed to at least a portion of the first memory array; and adjusting, based on the second cycle count metric, the demarcation voltage to be applied during read operations performed on memory cells of the first memory array. In an embodiment, a method further comprises deriving the at least one cycle count metric from information tracked by the controller to perform wear leveling among multiple memory arrays. In an embodiment, the first cycle count metric is based on a write cycle count for a slice of memory cells of the first memory array, wherein the write cycle count is stored in the slice.

In at least one embodiment, a non-transitory machine readable storage medium includes instructions stored thereon, the instructions when executed by a machine to cause the machine to track a first cycle count metric based at least in part on a number of writes performed to at least a portion of a first memory array comprising memory cells; and adjust, based on the first cycle count metric, a demarcation voltage to be applied during read operations performed on memory cells of the first memory array.

In an embodiment, the instructions when executed cause the machine to track a second cycle count metric based at least in part on a number of writes performed to at least a portion of a second memory array comprising memory cells, wherein a first memory chip comprises the first memory array and a second memory chip comprises the second memory array; and adjust, based on the second cycle count metric, a demarcation voltage to be applied during read operations performed on memory cells of the second memory array. In an embodiment, the adjusted demarcation voltage is to be applied during read operations performed on memory cells of a plurality of memory arrays of a semiconductor chip. In an embodiment, the instructions when executed cause the machine to adjust, based on the first cycle count metric, a plurality of demarcation voltages to be applied during a read operation performed on memory cells of the first memory array.

In at least one embodiment, a system comprises means for tracking a first cycle count metric based at least in part on a number of writes performed to at least a portion of a first memory array comprising a plurality of memory cells; and means for adjusting, based on the first cycle count metric, a demarcation voltage to be applied during read operations performed on memory cells of the first memory array.

In an embodiment, a system comprises means for tracking a second cycle count metric based at least in part on a number of writes performed to at least a portion of a second memory array comprising memory cells, wherein a first memory chip comprises the first memory array and a second memory chip comprises the second memory array; and means for adjusting, based on the second cycle count metric, a demarcation voltage to be applied during read operations performed on memory cells of the second memory array. In an embodiment, a system comprises means for applying the adjusted demarcation voltage during read operations performed on memory cells of a plurality of memory arrays of a semiconductor chip. In an embodiment, a system comprises means for adjusting, based on the first cycle count metric, a plurality of demarcation voltages to be applied during a read operation performed on memory cells of the first memory array.

In at least one embodiment, a system comprises a controller to track a first cycle count metric based at least in part on a number of writes performed to at least a portion of a memory array comprising a plurality of memory cells; and adjust, based on the first cycle count metric, a demarcation voltage to be applied during read operations performed on memory cells of the first memory array.

In an embodiment, the system further comprises the memory array. In an embodiment, a system further comprises a central processing unit of a host device, the central processing unit to send a read command to the controller. In an embodiment, a system further comprises a battery communicatively coupled to the central processing unit, a display communicatively coupled to the central processing unit, or a network interface communicatively coupled to the central processing unit.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a first memory array comprising a plurality of phase change memory (PCM) cells; and
   a controller to:
   track a first cycle count metric based at least in part on a number of writes performed to at least a portion of the first memory array;
   store a first association between a first threshold of the first cycle count metric and a first set of adjusted demarcation voltages and a second association between a second threshold of the first cycle count metric and a second set of adjusted demarcation voltages;
   adjust, based on the first cycle count metric, a first demarcation voltage comprising an initial demarcation voltage to be applied during a read operation performed on PCM cells of the first memory array and a second demarcation voltage comprising a demarcation voltage to be applied during the read operation responsive to a determination that a sense operation performed using the first demarcation voltage was unsuccessful, wherein the first demarcation voltage and the second demarcation voltage are adjusted downward by accessing the first association in response to a determination that the first cycle count metric has crossed the first threshold; and
   adjust the first demarcation voltage and second demarcation voltage further downward by accessing the second association in response to a determination that the first cycle count metric has crossed the second threshold.

2. The apparatus of claim 1, the controller to:
   track a second cycle count metric based at least in part on a number of writes performed to at least a portion of a second memory array comprising a second plurality of PCM cells, wherein a first memory chip comprises the first memory array and a second memory chip comprises the second memory array; and
   adjust, based on the second cycle count metric, a demarcation voltage to be applied during read operations performed on PCM cells of the second memory array.

3. The apparatus of claim 1, wherein the first demarcation voltage is to be applied during read operations performed on PCM cells of a plurality of memory arrays of a semiconductor chip.

4. The apparatus of claim 1, wherein the controller is to adjust, based on the first cycle count metric, a plurality of demarcation voltages to be applied during a read operation performed on PCM cells of the first memory array.

5. The apparatus of claim 1, wherein the first demarcation voltage is adjusted in response to a determination that the first cycle count metric has crossed a threshold.

6. The apparatus of claim 1, wherein the first cycle count metric is a $\mu$-$3\sigma$ write cycle count of a distribution of write cycle counts of a plurality of groups of PCM cells.

7. The apparatus of claim 1, wherein the first cycle count metric is an average of write cycle counts of a plurality of groups of PCM cells.

8. The apparatus of claim 1, wherein the first cycle count metric is a maximum write cycle count of a plurality of groups of PCM cells.

9. The apparatus of claim 1, wherein the controller is to:
   track a second cycle count metric based at least in part on the number of writes performed to at least a portion of the first memory array, wherein the second cycle count metric is calculated from the number of writes performed to at least the portion of the first memory array using a different methodology than a methodology used to calculate the first cycle count metric; and
   adjust, based on a determination that the second cycle count metric has crossed a third threshold, the first demarcation voltage downward.

10. The apparatus of claim 1, wherein the controller is to derive the first cycle count metric from information tracked by the controller to perform wear leveling among multiple memory arrays.

11. The apparatus of claim 1, wherein the first cycle count metric is based on a write cycle count for a slice of PCM cells of the first memory array, wherein the write cycle count is to be stored in the slice.

12. The apparatus of claim 1, further comprising a battery communicatively coupled to a processor, a display communicatively coupled to the processor, or a network interface communicatively coupled to the processor.

13. A method comprising:
   tracking a first cycle count metric based at least in part on a number of writes performed to at least a portion of a first memory array comprising a plurality of memory cells;
   storing a first association between a first threshold of the first cycle count metric and a first set of adjusted demarcation voltages and a second association between a second threshold of the first cycle count metric and a second set of adjusted demarcation voltages;

adjusting, based on the first cycle count metric, a first demarcation voltage comprising an initial demarcation voltage to be applied during a read operation performed on memory cells of the first memory array and a second demarcation voltage comprising a demarcation voltage to be applied during the read operation responsive to a determination that a sense operation performed using the first demarcation voltage was unsuccessful, wherein the first demarcation voltage and the second demarcation voltage are adjusted downward by accessing the first association in response to a determination that the first cycle count metric has crossed the first threshold; and adjusting the first demarcation voltage and second demarcation voltage further downward by accessing the second association in response to a determination that the first cycle count metric has crossed the second threshold.

14. The method of claim 13, further comprising:
tracking a second cycle count metric based at least in part on a number of writes performed to at least a portion of a second memory array comprising memory cells, wherein a first memory chip comprises the first memory array and a second memory chip comprises the second memory array; and adjusting, based on the second cycle count metric, a demarcation voltage to be applied during read operations performed on memory cells of the second memory array.

15. The method of claim 13, further comprising applying the first demarcation voltage during read operations performed on memory cells of a plurality of memory arrays of a semiconductor chip.

16. The method of claim 13, further comprising adjusting, based on the first cycle count metric, a plurality of demarcation voltages to be applied during a read operation performed on memory cells of the first memory array.

17. A non-transitory machine readable storage medium having instructions stored thereon, the instructions when executed by a machine to cause the machine to:
track a first cycle count metric based at least in part on a number of writes performed to at least a portion of a first memory array comprising memory cells;
store a first association between a first threshold of the first cycle count metric and a first set of adjusted demarcation voltages and a second association between a second threshold of the first cycle count metric and a second set of adjusted demarcation voltages;
adjust, based on the first cycle count metric, a first demarcation voltage comprising an initial demarcation voltage to be applied during a read operation performed on memory cells of the first memory array and a second demarcation voltage comprising a demarcation voltage to be applied during the read operation responsive to a determination that a sense operation performed using the first demarcation voltage was unsuccessful, wherein the first demarcation voltage and the second demarcation voltage are adjusted downward by accessing the first association in response to a determination that the first cycle count metric has crossed the first threshold; and
adjust the first demarcation voltage and second demarcation voltage further downward by accessing the second association in response to a determination that the first cycle count metric has crossed the second threshold.

18. The medium of claim 17, the instructions when executed to cause the machine to:
track a second cycle count metric based at least in part on a number of writes performed to at least a portion of a second memory array comprising memory cells, wherein a first memory chip comprises the first memory array and a second memory chip comprises the second memory array; and
adjust, based on the second cycle count metric, a demarcation voltage to be applied during read operations performed on memory cells of the second memory array.

19. The medium of claim 17, wherein the first demarcation voltage is to be applied during read operations performed on memory cells of a plurality of memory arrays of a semiconductor chip.

20. The medium of claim 17, the instructions when executed to cause the machine to adjust, based on the first cycle count metric, a plurality of demarcation voltages to be applied during a read operation performed on memory cells of the first memory array.

21. A system comprising:
a controller comprising circuitry to:
track a first cycle count metric based at least in part on a number of writes performed to at least a portion of a memory array comprising a plurality of memory cells;
store a first association between a first threshold of the first cycle count metric and a first set of adjusted demarcation voltages and a second association between a second threshold of the first cycle count metric and a second set of adjusted demarcation voltages;
adjust, based on the first cycle count metric, a first demarcation voltage comprising an initial demarcation voltage to be applied during a read operation performed on memory cells of the portion of the memory array and a second demarcation voltage comprising a demarcation voltage to be applied during the read operation responsive to a determination that a sense operation performed using the first demarcation voltage was unsuccessful, wherein the first demarcation voltage and the second demarcation voltage are adjusted downward by accessing the first association in response to a determination that the first cycle count metric has crossed the first threshold; and
adjust the first demarcation voltage and second demarcation voltage further downward by accessing the second association in response to a determination that the first cycle count metric has crossed the second threshold.

22. The system of claim 21, further comprising the memory array.

23. The system of claim 21, further comprising a central processing unit of a host device, the central processing unit to send a read command to the controller.

24. The system of claim 23, further comprising a battery communicatively coupled to the central processing unit, a display communicatively coupled to the central processing unit, or a network interface communicatively coupled to the central processing unit.

* * * * *